United States Patent
Huang et al.

(10) Patent No.: US 12,484,225 B2
(45) Date of Patent: Nov. 25, 2025

(54) METAL HYBRID CHARGE STORAGE STRUCTURE FOR MEMORY

(71) Applicant: Intel NDTM US LLC, Santa Clara, CA (US)

(72) Inventors: Guangyu Huang, El Dorado, CA (US); Dipanjan Basu, Portland, OR (US); Meng-Wei Kuo, Boise, ID (US); Randy Koval, Albuquerque, NM (US); Henok Mebrahtu, Shanghai (CN); Minsheng Wang, Shanghai (CN); Jie Li, Shanghai (CN); Fei Wang, Shanghai (CN); Qun Gao, Shanghai (CN); Xingui Zhang, Shanghai (CN); Guanjie Li, Shanghai (CN)

(73) Assignee: Intel NDTM US LLC, Santa Clara, CA (US)

( * ) Notice: Subject to any disclaimer, the term of this patent is extended or adjusted under 35 U.S.C. 154(b) by 821 days.

(21) Appl. No.: 17/375,540

(22) Filed: Jul. 14, 2021

(65) Prior Publication Data
US 2022/0415908 A1  Dec. 29, 2022

(30) Foreign Application Priority Data
Jun. 25, 2021  (WO) ................ PCT/CN2021/102384

(51) Int. Cl.
*H10B 43/35* (2023.01)
*H10D 30/01* (2025.01)
*H10D 30/69* (2025.01)
*H10D 64/01* (2025.01)
*H10B 43/27* (2023.01)

(52) U.S. Cl.
CPC .......... *H10B 43/35* (2023.02); *H10D 30/0413* (2025.01); *H10D 30/691* (2025.01); *H10D 30/694* (2025.01); *H10D 64/037* (2025.01); *H10B 43/27* (2023.02)

(58) Field of Classification Search
CPC ... H10B 43/35; H10B 43/27; H01L 29/40117; H01L 29/4234; H01L 29/66833; H01L 29/7923
See application file for complete search history.

(56) References Cited

U.S. PATENT DOCUMENTS

2005/0285183 A1   12/2005   Baik
2010/0001281 A1   1/2010   Mieno
(Continued)

FOREIGN PATENT DOCUMENTS

CN    110034119 A    7/2019

OTHER PUBLICATIONS

International Search Report and Written Opinion for Application No. PCT/CN2021/102384, mailed Mar. 23, 2022, 8 pages.

*Primary Examiner* — Mohammad M Choudhry
(74) *Attorney, Agent, or Firm* — Morgan, Lewis & Bockius LLP

(57) ABSTRACT

Systems, apparatuses and methods may provide for memory cell technology comprising a control gate, a conductive channel, and a charge storage structure coupled to the control gate and the conductive channel, wherein the charge storage structure includes a polysilicon layer and a metal layer. In one example, the metal layer includes titanium nitride or other high effective work function metal.

20 Claims, 4 Drawing Sheets

(56) References Cited

U.S. PATENT DOCUMENTS

| | | | | |
|---|---|---|---|---|
| 2013/0264628 A1* | 10/2013 | Koval | ............ | H01L 21/76 |
| | | | | 257/316 |
| 2014/0003148 A1* | 1/2014 | Sun | ............ | H01L 29/7926 |
| | | | | 257/E27.06 |
| 2015/0008505 A1* | 1/2015 | Chien | ............ | H10B 41/20 |
| | | | | 257/324 |
| 2019/0103411 A1* | 4/2019 | Liu | ............ | H10B 43/35 |
| 2020/0098770 A1 | 3/2020 | Liu et al. | | |
| 2020/0395412 A1* | 12/2020 | Lee | ............ | G11C 16/10 |

* cited by examiner

METAL HYBRID CHARGE STORAGE STRUCTURE FOR MEMORY

CROSS-REFERENCE TO RELATED APPLICATIONS

The present application claims the benefit of priority to PCT Provisional Patent Application No. PCT/CN2021/102384 filed on Jun. 25, 2021.

TECHNICAL FIELD

Embodiments generally relate to memory architectures. More particularly, embodiments relate to metal hybrid charge storage structures for memory.

BACKGROUND

Flash memory is a type of computer memory that utilizes floating gate transistors such as metal-oxide-semiconductor field-effect transistors (MOSFETs), as memory cells to store information. Types of commercialized flash memory are NAND and NOR memory. In NAND memory, the cells are arranged in an array such that a control gate of each memory cell in a row is connected to form an access line, such as a word line.

Data density of flash memory devices can be increased by increasing the number of bits of information stored per memory cell. For example, a triple level cell (TLC) stores three bits per memory cell, a quad level cell (QLC) stores four bits per memory cell, a penta level cell (PLC) stores five bits per memory cell, and so forth. One drawback of increasing data density, however, is the increased number of voltage states used to store the information. For example, TLC uses eight voltage states, QLC uses sixteen voltage states, and PLC uses thirty-two voltage states to store the number of bits of information required per cell. Increasing data density in this manner may reduce the amount of margin separating the voltage states and increase the possibility of errors.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

As data density in flash memory cells increases, increasing program erase windows (PEWs) may reduce or otherwise minimize the possibility for errors. The PEW may be limited, however, by the programming saturation voltage (Vtpsat) threshold.

Figure 1:
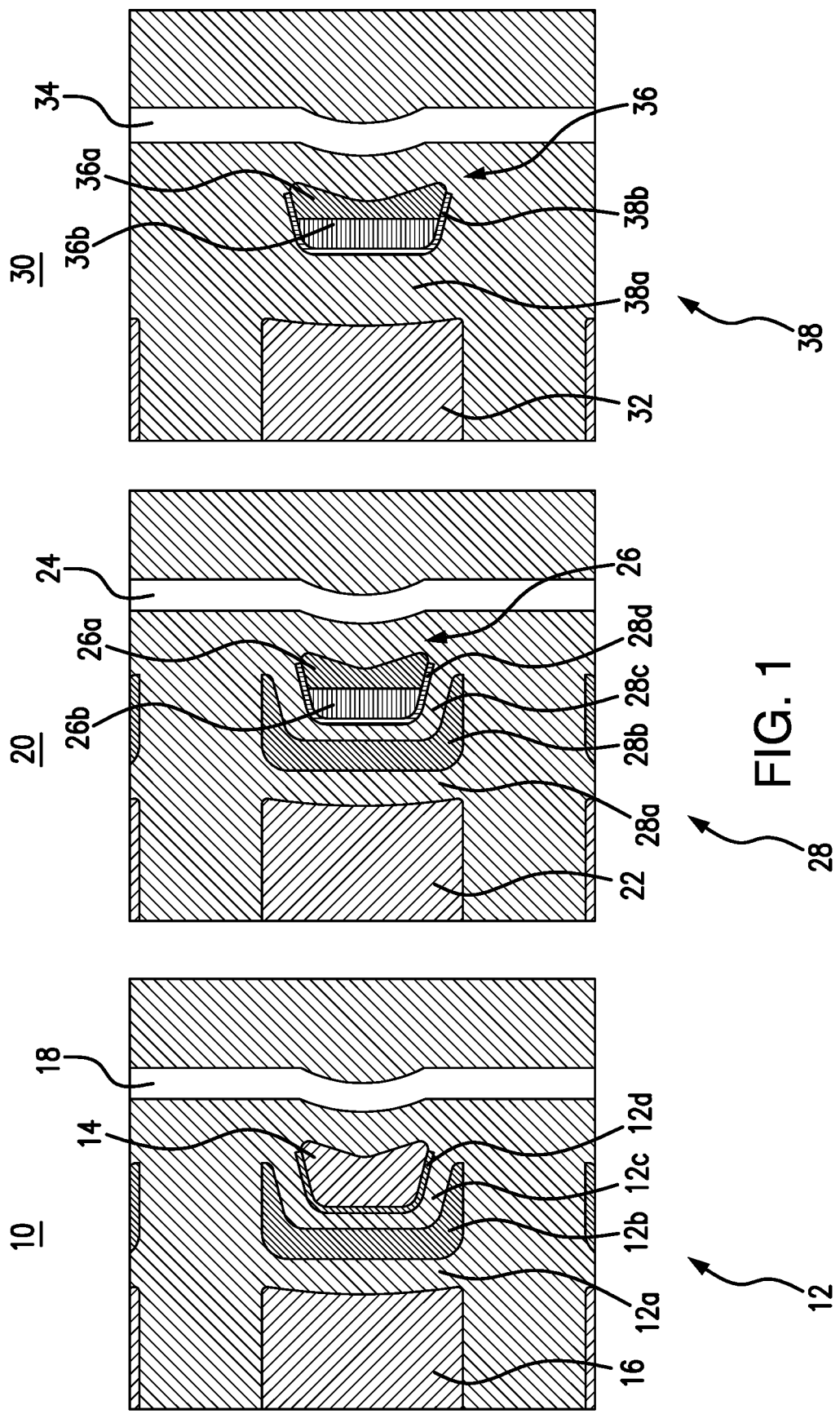
FIG. 1 is a comparative sectional view of an example of a conventional memory cell and memory cells according to embodiments.

FIG. 1 demonstrates that a conventional memory cell 10 includes interpoly dielectric (IPD) layers 12 (12a-12d) positioned between a charge storage structure 14 and a control gate 16. The IPD layers 12 are designed to control electron leakage, which may be a significant factor in limiting the programming saturation voltage threshold. The illustrated IPD configuration includes four dielectric layers in an oxide-nitride-oxide-nitride (ONON) configuration. For example, a first IPD layer 12a may include oxide, a second IPD layer 12b may include nitride, a third IPD layer 12c may include oxide, and a fourth IPD layer 12d may include nitride. The charge storage structure 14 is also coupled to a conductive channel 18 via a dielectric layer. The illustrated IPD configuration may be unable to yield acceptable results for PLC and higher memory architectures due to the possibility of errors when programming or reading from the conventional memory cell 10.

By contrast, a first enhanced memory cell 20 includes a control gate 22, a conductive channel 24, and a hybrid charge storage structure 26 (26a, 26b, e.g., charge trap, floating gate) coupled to the control gate 22 and the conductive channel 24. More particularly, the hybrid charge storage structure 26 includes a polysilicon layer 26a and a "backside" metal layer 26b. As illustrated, the polysilicon layer 26a is positioned between the metal layer 26b and the conductive channel 24. The metal layer 26b, which may include titanium nitride (TiN) or other high effective work function metal closer to 5 eV, provides a higher backside IPD conduction band barrier due to metal pined quasi-fermi potential. A higher band offset between the metal and IPD layers increases the tunneling barrier for IPD leakage, and therefore provides the programming saturation gain.

In the illustrated example, the charge storage structure 26 is coupled to the control gate 22 via four dielectric layers 28 (28a-28d). The four dielectric layers 28 may also include IPD layers having an ONON configuration. The first enhanced memory cell 20 therefore enhances performance at least to the extent that the metal layer 26b enables the memory cell 20 to be used in a PLC architecture having a PEW of approximately 1 Volt (V).

A second enhanced memory cell 30 includes a control gate 32, a conductive channel 34, and a hybrid charge storage structure 36 (36a, 36b) coupled to the control gate 32 and the conductive channel 34. Again, the hybrid charge storage structure 36 may include a polysilicon layer 36a and a metal layer 36b (e.g., TiN, Ru, RuO2), which provides a higher backside IPD conduction band barrier due to metal pined quasi-fermi potential.

In the illustrated example, the charge storage structure 36 is coupled to the control gate 32 via two dielectric layers 38 (38a, 38b, e.g., IPD layers). In one example, the two dielectric layers 38 have an ON (oxide-nitride) configuration. As illustrated, dielectric layer 38a contacts the polysilicon layer 36a of the charge storage structure 36 and dielectric layer 38b contacts both the polysilicon layer 36a and the metal layer 36b of the charge storage structure 36. The second enhanced memory cell 30 therefore enhances performance at least to the extent that the metal layer 36b enables the memory cell 30 to be used in a PLC architecture having a PEW of approximately 1V. For example, the programming saturation voltage threshold may be above 1V gain, normalized by the gate voltage and the threshold voltage. The second enhanced memory cell 30 also enables the pillar pitch (e.g., lateral distance between pillars/strings)

and tier pitch (e.g., vertical distance between tiers in a three-dimensional/3D NAND architecture) to be reduced. Moreover, eliminating IPD layers simplifies fabrication costs in terms of both time and materials.

Figures 2A, 2B, 2C, 2D, 2E, 2F, 2G:
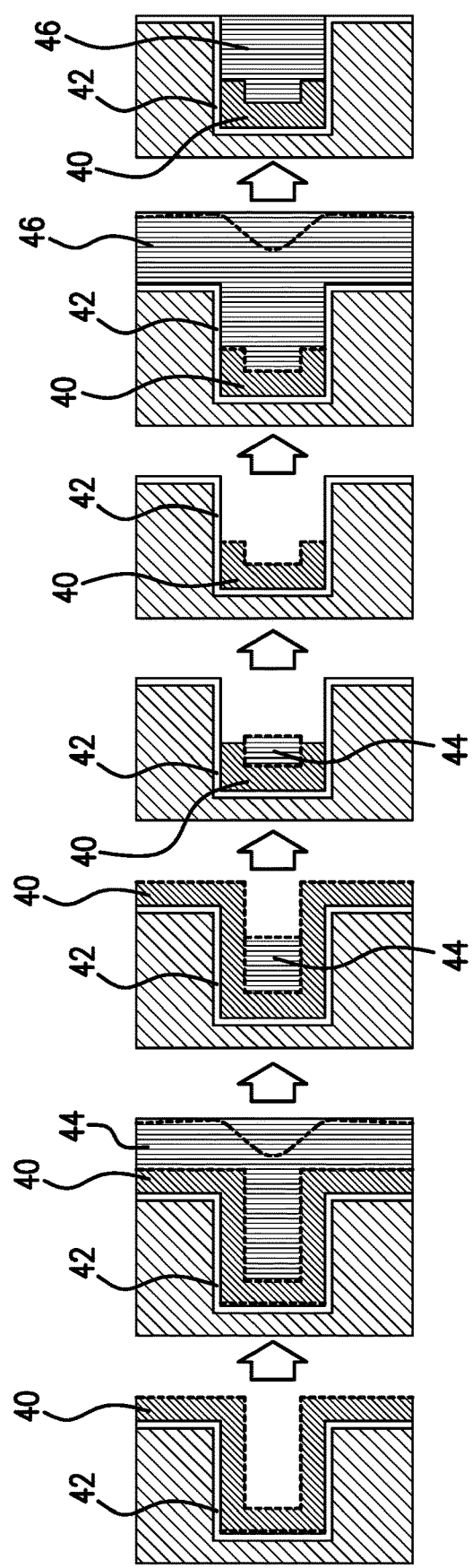
FIGS. 2A-2G are sectional views of an example of a memory cell fabrication sequence according to an embodiment.

Turning now to FIGS. 2A-2G, an enhanced memory cell fabrication sequence is shown. More particularly, FIG. 2A demonstrates that a metal layer 40 (e.g., TiN) may be deposited on a dielectric layer 42 (e.g., IPD layer). In FIG. 2B, an initial polysilicon layer 44 is deposited on the metal layer 40. In FIG. 2C, the initial polysilicon layer 44 is cut down (e.g., etched via an integrated wet process). In FIG. 2D, the metal layer 40 is cut down, wherein the initial polysilicon layer is removed in FIG. 2E. In FIG. 2F, a subsequent polysilicon layer 46 is deposited on the metal layer 40 and the dielectric layer 42, wherein the subsequent polysilicon layer 46 is cut down in FIG. 2G. In an embodiment, the illustrated fabrication sequence in FIGS. 2A-2G provides improved controllability over the thickness of the metal layer 40 (e.g., the deposition in FIG. 2A is highly controllable).

Figure 3D:
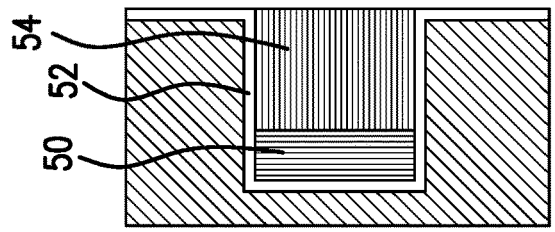
FIGS. 3A-3D are sectional views of an example of a memory cell fabrication sequence according to another embodiment.
Figure 3C:
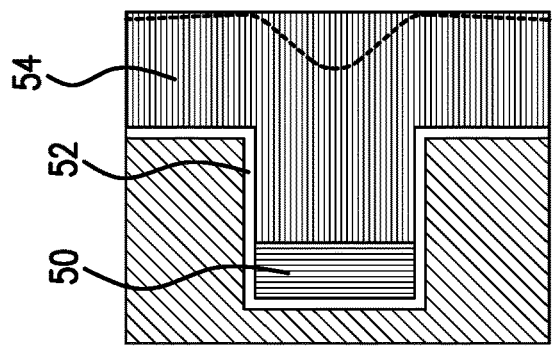
Figure 3B:
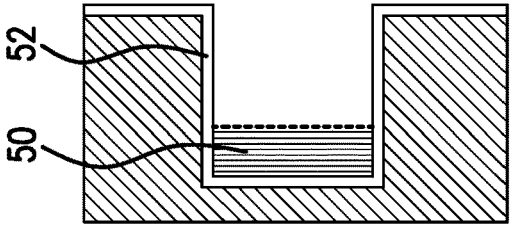
Figure 3A:
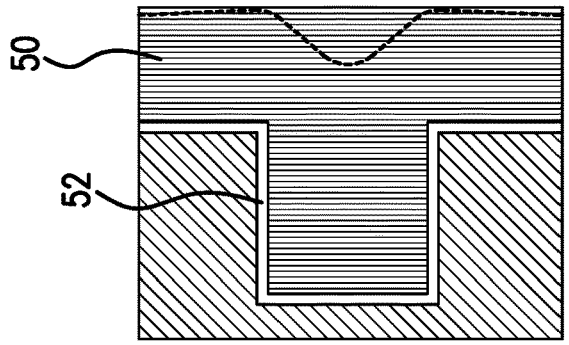

FIGS. 3A-3D show another enhanced memory cell fabrication sequence. In the illustrated example, a metal layer 50 (e.g., TiN) is deposited on a dielectric layer 52 (e.g., IPD layer) in FIG. 3A. In FIG. 3B, the metal layer 50 is cut down. A polysilicon layer 54 is deposited on the metal layer 50 and the dielectric layer 52 in FIG. 3C. In FIG. 3D, the polysilicon layer 54 is cut down. In an embodiment, the illustrated fabrication sequence in FIGS. 3A-3D provides for a more simplified process.

Figure 4:
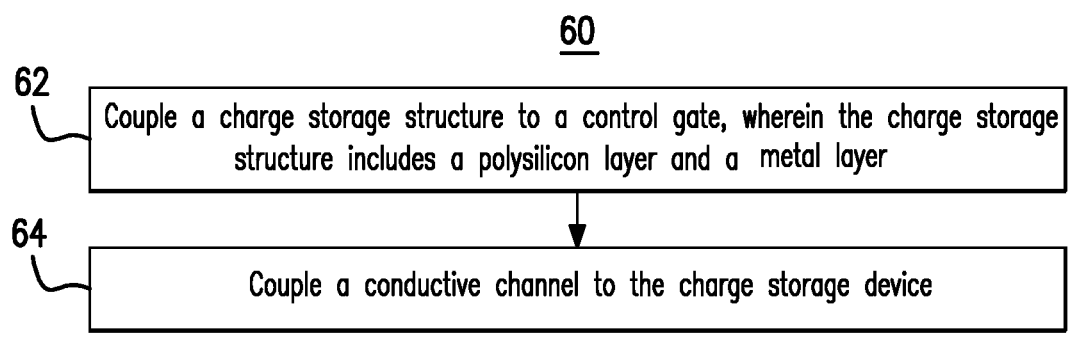
FIG. 4 is a flowchart of an example of a method of fabricating a memory cell according to an embodiment.

FIG. 4 shows a method 60 of fabricating a memory cell. The method 60 may be implemented as one or more modules in a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field-programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. The method 60 may also be implemented via suitable semiconductor processes such as, for example, deposition, cutting and/or etching techniques.

Illustrated processing block 62 couples a charge storage structure to a control gate, wherein the charge storage structure includes a polysilicon layer and a metal layer (e.g., backside metal layer positioned between the control gate and the polysilicon layer). In one example, block 62 includes the fabrication sequence shown in FIGS. 2A-2G. In another example, block 62 includes the fabrication sequence shown in FIGS. 3A-3D. Block 64 couples a conductive channel to the charge storage structure. In an embodiment, the conductive channel has a hollow interior that is filled with an insulative material, such as an oxide material. The conductive channel and a string of memory cells may be oriented vertically, such as in a 3D memory array. In an embodiment, the conductive channel has a generally cylindrical configuration and the structures of each memory cell are disposed in concentric ring-like structures radially outward from the conductive channel.

Figure 5:
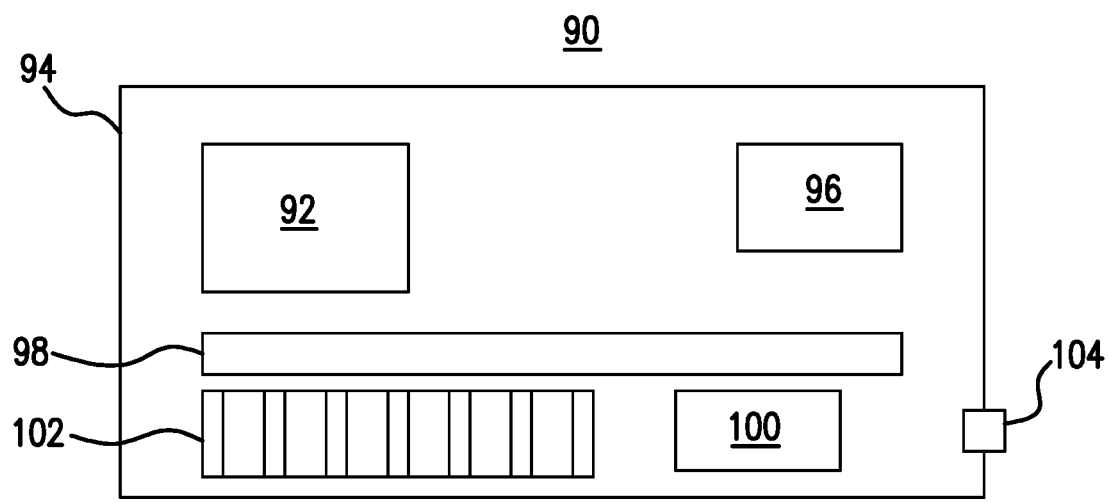
FIG. 5 is a plan view of an example of a computing system according to an embodiment.

Turning now to FIG. 5, a performance-enhanced computing system 90 is shown. The system 90 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot), Internet of Things (IoT) functionality, etc., or any combination thereof.

The illustrated computing system 90 includes a mass storage device 92 (e.g., flash memory) as disclosed herein, coupled to a motherboard 94. In one aspect, the computing system 90 also includes a processor 96, a system memory device 98, a radio 100, a heat sink 102, a port 104, a slot (not shown), or any other suitable device or component, which can be operably coupled to the motherboard 94. In an embodiment, the mass storage device 92 is a memory device that includes a plurality of PLC memory cells such as, for example, the first enhanced memory cell 20 (FIG. 1) and/or the second enhanced memory cell 30 (FIG. 1), already discussed.

Additional Notes and Examples

Example 1 includes a memory cell comprising a control gate, a conductive channel, and a charge storage structure coupled to the control gate and the conductive channel, wherein the charge storage structure includes a polysilicon layer and a metal layer.

Example 2 includes the memory cell of Example 1, wherein the metal layer includes titanium nitride.

Example 3 includes the memory cell of Example 1, wherein the charge storage structure is coupled to the control gate via four dielectric layers.

Example 4 includes the memory cell of Example 3, wherein the four dielectric layers include interpoly dielectric layers.

Example 5 includes the memory cell of Example 1, wherein the charge storage structure is coupled to the control gate via two dielectric layers.

Example 6 includes the memory cell of Example 5, wherein the two dielectric layers include an interpoly dielectric layer.

Example 7 includes the memory cell of any one of Examples 1 to 6, wherein the memory cell is a penta level cell.

Example 8 includes a performance-enhanced computing system comprising a motherboard, a processor coupled to the motherboard, and a memory device coupled to the motherboard, wherein the memory device includes a plurality of memory cells, and wherein one or more of the memory cells includes a control gate, a conductive channel, and a charge storage structure coupled to control gate and the conductive channel, wherein the charge storage structure includes a polysilicon layer and a metal layer.

Example 9 includes the computing system of Example 8, wherein the metal layer includes titanium nitride.

Example 10 includes the computing system of Example 8, wherein the charge storage structure is coupled to the control gate via four dielectric layers.

Example 11 includes the computing system of Example 10, wherein the four dielectric layers include interpoly dielectric layers.

Example 12 includes the computing system of Example 8, wherein the charge storage structure is coupled to the control gate via two dielectric layers.

Example 13 includes the computing system of Example 12, wherein the two dielectric layers include an interpoly dielectric layer.

Example 14 includes the computing system of any one of Examples 8 to 13, wherein the memory cell is a penta level cell.

Example 15 includes a method of fabricating a memory cell, the method comprising coupling a charge storage structure to a control gate, wherein the charge storage structure includes a polysilicon layer and a metal layer, and coupling a conductive channel to the charge storage structure.

Example 16 includes the method of Example 15, wherein the metal layer includes titanium nitride.

Example 17 includes the method of any one of Examples 15 to 16, wherein the charge storage structure is coupled to the control gate via four dielectric layers.

Example 18 includes the method of Example 17, wherein the four dielectric layers include interpoly dielectric layers.

Example 19 includes the method of any one of Examples 15 to 16, wherein the charge storage structure is coupled to the control gate via two dielectric layers.

Example 20 includes the method of Example 19, wherein the two dielectric layers include an interpoly dielectric layer.

Technology described herein increases the NAND PEW with comparable cell performance. The technology also scales down pillar pitch and tier pitch with an enlarged charge storage structure length. Additionally, the technology simplifies the fabrication process and reduces cost.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory cell, comprising:
   a control gate;
   a conductive channel; and
   a charge storage structure coupled to the control gate and the conductive channel, wherein the charge storage structure includes a polysilicon layer and a metal layer, wherein the polysilicon layer is positioned between the metal layer and the conductive channel, the charge storage structure is coupled to the control gate via two dielectric layers, a first dielectric layer of the two dielectric layers contacts the polysilicon layer of the charge storage structure, and a second dielectric layer of the two dielectric layers directly contacts both the polysilicon layer and the metal layer of the charge storage structure via a plurality of sides of each of the polysilicon layer and the metal layer.

2. The memory cell of claim 1, wherein the metal layer includes titanium nitride.

3. The memory cell of claim 1, wherein the charge storage structure is coupled to the control gate via four dielectric layers.

4. The memory cell of claim 3, wherein the four dielectric layers include interpoly dielectric layers.

5. The memory cell of claim 1, wherein the first dielectric layer contacts the polysilicon layer via a first surface of the polysilicon layer, and a portion of the first surface is recessed towards the metal layer.

6. The memory cell of claim 1, wherein the memory cell is a penta level cell.

7. A computing system, comprising:
   a motherboard;
   a processor coupled to the motherboard; and
   a memory device coupled to the motherboard, wherein the memory device includes a plurality of memory cells, and wherein one or more of the memory cells includes:
   a control gate,
   a conductive channel, and
   a charge storage structure coupled to the control gate and the conductive channel, wherein the charge storage structure includes a polysilicon layer and a metal layer, and wherein the polysilicon layer is positioned between the metal layer and the conductive channel, the charge storage structure is coupled to the control gate via two dielectric layers, a first dielectric layer of the two dielectric layers contacts the polysilicon layer of the charge storage structure, and a second dielectric layer of the two dielectric layers directly contacts both the polysilicon layer and the metal layer of the charge storage structure via a plurality of sides of each of the polysilicon layer and the metal layer.

8. The computing system of claim 7, wherein the metal layer includes titanium nitride.

9. The computing system of claim 7, wherein the charge storage structure is coupled to the control gate via four dielectric layers.

10. The computing system of claim 9, wherein the four dielectric layers include interpoly dielectric layers.

11. The computing system of claim 7, wherein the two dielectric layers include an interpoly dielectric layer.

12. The computing system of claim 7, wherein each of the plurality of memory cells is a penta level cell.

13. A method of fabricating a memory cell, the method comprising:
coupling a charge storage structure to a control gate, wherein the charge storage structure includes a polysilicon layer and a metal layer; and
coupling a conductive channel to the charge storage structure, wherein the polysilicon layer is positioned between the metal layer and the conductive channel, the charge storage structure is coupled to the control gate via two dielectric layers, a first dielectric layer of the two dielectric layers contacts the polysilicon layer of the charge storage structure, and a second dielectric layer of the two dielectric layers directly contacts both the polysilicon layer and the metal layer of the charge storage structure via a plurality of sides of each of the polysilicon layer and the metal layer.

14. The method of claim 13, wherein the metal layer includes titanium nitride.

15. The method of claim 13, wherein the charge storage structure is coupled to the control gate via four dielectric layers.

16. The method of claim 15, wherein the four dielectric layers include interpoly dielectric layers.

17. The method of claim 13, wherein the two dielectric layers include an interpoly dielectric layer.

18. The memory cell of claim 1, wherein the plurality of sides of each of the polysilicon layer and the metal layer includes a bottom side of the metal layer adjacent to the control gate and at least one peripheral side of the metal layer connected to the bottom side of the metal layer.

19. The memory cell of claim 1, wherein the first dielectric layer wraps around the charge storage structure and the second dielectric layer.

20. The memory cell of claim 1, wherein the first dielectric layer includes a single type of dielectric material filling a gap between the control gate and the second dielectric layer.

* * * * *